(12) United States Patent
Chiu et al.

(10) Patent No.: US 12,198,958 B2
(45) Date of Patent: Jan. 14, 2025

(54) SUBSTRATE STORAGE APPARATUS PROVIDED WITH STORAGE ENVIRONMENT DETECTION

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Hsin-Min Hsueh, New Taipei (TW); Yun-Zi Lin, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 612 days.

(21) Appl. No.: 17/386,851

(22) Filed: Jul. 28, 2021

(65) Prior Publication Data
US 2022/0104365 A1    Mar. 31, 2022

Related U.S. Application Data

(60) Provisional application No. 63/085,221, filed on Sep. 30, 2020.

(51) Int. Cl.
| | |
|---|---|
| *H01L 21/673* | (2006.01) |
| *G03F 7/00* | (2006.01) |
| *G08C 17/02* | (2006.01) |
| *H05K 5/00* | (2006.01) |
| *H05K 5/02* | (2006.01) |

(52) U.S. Cl.
CPC .... *H01L 21/67359* (2013.01); *G03F 7/70741* (2013.01); *G08C 17/02* (2013.01); *H01L 21/67369* (2013.01); *H01L 21/67383* (2013.01); *H01L 21/67396* (2013.01); *H05K 5/0034* (2013.01); *H05K 5/0208* (2013.01)

(58) Field of Classification Search
CPC ............................ H05K 5/0034; H05K 5/0208
USPC .......................................... 206/710, 711, 712
See application file for complete search history.

(56) References Cited

U.S. PATENT DOCUMENTS

| | | | | |
|---|---|---|---|---|
| 5,740,845 A | * | 4/1998 | Bonora | ............. H01L 21/67373 414/217 |
| 7,528,936 B2 | * | 5/2009 | Gregerson | ........ H01L 21/67376 355/75 |
| 7,648,041 B2 | * | 1/2010 | Ueda | ................. H01L 21/67126 220/323 |

(Continued)

FOREIGN PATENT DOCUMENTS

| | | |
|---|---|---|
| JP | 2004047929 A | 2/2004 |
| JP | 2020021778 A | 2/2020 |

*Primary Examiner* — Ernesto A Grano

(74) *Attorney, Agent, or Firm* — Locke Lord LLP; Tim Tingkang Xia, Esq.

(57) ABSTRACT

The invention discloses a substrate storage apparatus having a detecting device detachably connecting to an outer pod. The detecting device includes a sensing member having a sensing terminal, a cavity and a sensor. The sensing terminal detachably connects to the outer pod such that the sensing terminal exposes in an accommodating space inside of the outer pod. The cavity receiving the sensor extends to an outside of the outer pod and the accommodating space. The cavity communicates with the accommodating space through the sensing terminal, allowing the sensor to read information regarding the accommodating space.

16 Claims, 10 Drawing Sheets

(56) References Cited

U.S. PATENT DOCUMENTS

| | | | | |
|---|---|---|---|---|
| 8,074,597 B2* | 12/2011 | Shah | ............... | H01L 21/67393 |
| | | | | 156/345.31 |
| 8,403,143 B2* | 3/2013 | Chiu | ............... | H01L 21/67353 |
| | | | | 206/724 |
| 8,893,753 B2* | 11/2014 | Okabe | ............ | H01L 21/67393 |
| | | | | 414/935 |
| 10,876,647 B2* | 12/2020 | Chiu | ................ | F16K 27/0209 |
| 11,143,974 B1* | 10/2021 | Moon | ............ | H01L 21/67051 |
| 2002/0124906 A1* | 9/2002 | Suzuki | ............ | H01L 21/67366 |
| | | | | 141/98 |
| 2006/0076264 A1* | 4/2006 | CletusWittman | ... | G03F 7/70741 |
| | | | | 206/454 |
| 2008/0041760 A1* | 2/2008 | Durben | ............ | H01L 21/67359 |
| | | | | 414/217.1 |
| 2009/0038976 A1* | 2/2009 | Lin | ................ | H01L 21/67359 |
| | | | | 206/454 |
| 2011/0114129 A1* | 5/2011 | Kishkovich | ....... | H01L 21/67769 |
| | | | | 15/300.1 |
| 2012/0175279 A1* | 7/2012 | Ku | .................... | G03F 7/70741 |
| | | | | 206/454 |
| 2013/0174640 A1* | 7/2013 | Oh | ................... | H01L 21/67389 |
| | | | | 206/710 |
| 2014/0116920 A1* | 5/2014 | Lee | .................. | B65D 81/2015 |
| | | | | 53/485 |
| 2020/0211876 A1* | 7/2020 | Raschke | .................. | G03F 1/66 |
| 2021/0116821 A1* | 4/2021 | Chuang | ............ | H01L 21/67359 |
| 2021/0358787 A1* | 11/2021 | Chiu | ................ | H01L 21/67353 |
| 2022/0291596 A1* | 9/2022 | Chiu | .................. | G03F 7/70741 |
| 2022/0351998 A1* | 11/2022 | Lin | .................. | H01L 21/67386 |

* cited by examiner

SUBSTRATE STORAGE APPARATUS PROVIDED WITH STORAGE ENVIRONMENT DETECTION

BACKGROUND OF THE INVENTION

Field of the Invention

The present invention relates to a substrate storage apparatus, and more particularly, to a substrate storage apparatus provided with internal storage environment detection and a method of connecting a storage environment detection means to a substrate storage apparatus.

Description of the Prior Art

In the current extreme ultraviolet (EUV) lithography, shields involved require protection by dedicated EUV shield packages. FIG. 1 shows a shield package for storing such EUV shield. The shield package has inner-layer and outer-layer accommodating spaces defined by an outer pod (100) and an inner pod (110). The outer pod (100) includes a cover (101) and a base (102), and the two are joined to define an accommodating space for accommodating the inner pod (110). The inner pod (110) includes a cover (111) and a base (112) which are joined by a special means to define an accommodating space providing an sealing effect to accommodate a shield (120).

In a known cleaning process, the outer pod (100) accommodating the inner pod (110) is forwarded into a cleaning apparatus for processing, a cleaning liquid or gas is introduced into the accommodating space in the outer pod (100) to clean the inside of the outer pod (100) and the outside of the inner pod (110), and a drying gas is introduced into the outer pod (100) to dry any residual liquid and moisture. Any residual moisture attached to the inner pod (110) may affect the level of cleanliness of the shield. Thus, storage environment monitoring of the cleaning process becomes an important operation. When the outer pod (100) is in a stored state, that is, when the cover (101) and the base (102) are mutually joined, environmental information, such as humidity, of the internal storage environment cannot be obtained by measuring through an electronic apparatus. Even if a sensor is provided inside the outer pod (100), the cleaning liquid or drying gas increases the risk of damage of the electrical sensor. Moreover, a wafer storage apparatus demanding extreme cleanliness may also encounter the same problem.

In view of monitoring limitations of a substrate storage apparatus during a cleaning process, there is a need for the development of a substrate storage apparatus provided with storage environment detection and capable of effectively reducing the risk of damage caused by a cleaning gas or drying gas.

SUMMARY OF THE INVENTION

It is an object of the present invention to provide a substrate storage apparatus, including an outer pod for accommodating an inner pod and a detection device detachably connected to the outer pod. The inner pod is used for accommodating a substrate. The detection device includes: a sensing member having a sensing terminal, a cavity and a sensor. The sensing member is detachably connected to the outer pod such that the sensing terminal is exposed in an accommodating space on an inside of the outer pod, the cavity extends between an outside of the outer pod and the accommodating space and accommodates the sensor, and the cavity is in flow communication with the accommodating space of the outer pod through the sensing terminal, thereby allowing the sensor to read information associated with the accommodating space.

In a specific embodiment, the sensing terminal of the sensing member has a ventilation component, so that the cavity of the sensing member is in flow communication with the accommodating space of the outer pod through the ventilation component.

In a specific embodiment, the sensing member further has a connection terminal. The connection terminal is exposed on the outside of the outer pod, and the connection terminal is provided with a first connector electrically coupled to the sensor and used for transmitting a sensing signal.

In a specific embodiment, the first connector extends from the connection terminal of the sensing member to the outside.

In a specific embodiment, the sensing member includes an outer shell and an inner shell. The outer shell and the inner shell are mutually detachably connected and define the cavity. The outer shell is provided with the connection terminal exposed on the outside of the outer pod, and the inner shell is provided with the sensing terminal exposed in the accommodating space of the outer pod.

In a specific embodiment, an inner surface of the outer shell and an outer surface of the inner shell are connected, and the inner shell extends to the outside and the accommodating space of the outer pod.

In a specific embodiment, an outer surface of the outer shell and an inner surface of the inner shell are connected, and the outer shell extends to the outside and the accommodating space of the outer pod.

In a specific embodiment, the outer shell and the inner shell are mutually rotatably and detachably connected.

In a specific embodiment, the outer shell and the inner shell are fixed on a wall of the outer pod, and the wall is sandwiched between the outer shell and the inner shell.

In a specific embodiment, the detection device further includes: an mating member having an mating terminal and a housing. The mating terminal extends from the housing and is detachably connected to the outer shell of the sensing member. The housing accommodates a circuit component, and the circuit component is electrically coupled to the first connector through the mating terminal.

In a specific embodiment, the mating terminal is provided with a second connector. The second connector structurally matches and is electrically connected to the first connector so as to receive the sensing signal.

In a specific embodiment, the first connector extends in a mounting direction from the connection terminal of the sensing member to the outside, and the second connector is detachably connected in the mounting direction to the first connector, such that the mating terminal of the mating member is detachably connected to the outer shell of the sensing member.

In a specific embodiment, the mating terminal has a bow member. The bow member is detachably sleeved on the outer shell of the sensor, such that the mating member is connected to the sensing member.

In a specific embodiment, the mating member further has a connection arm. When the mating member is connected to the sensing member, a free terminal of the connection arm is fixedly connected to the outer pod, thereby stabilizing the connection between the mating member and the sensing member.

In a specific embodiment, the circuit component includes a processing unit, a display module and a wireless communication module. The wireless communication module transmits the sensing signal.

It is another object of the present invention to provide a method of mounting a detection device to a substrate storage apparatus. The method includes: providing a sensing member, the sensing member having a sensing terminal, a cavity, a sensor and a connection terminal, wherein the cavity accommodates the sensor and the connection terminal is provided with a first connector; detachably connecting the sensing member to an outer pod, such that the sensing terminal is exposed in an accommodating space of the outer pod, the cavity extends between an outside and the accommodating space of the outer pod, and the cavity is in flow communication with the accommodating space of the outer pod through the sensing terminal; and extending the first connector in a mounting direction to the outside of the outer pod.

In a specific embodiment, the method further includes: providing an mating member, the mating member having an mating terminal and a housing, wherein the mating terminal extends from the housing, the mating terminal is provided with a second connector, and the housing accommodates a circuit component; joining the mating member in the mounting direction with the sensing member, such that the mating terminal of the mating member is connected to the connection terminal of the sensing member and the first connector is electrically connected to the second connector.

In a specific embodiment, the joining of the mating member in the mounting direction with the sensing member further includes: providing the mating member with a connection arm, and fixedly connecting a free terminal of the connection arm to the outer pod, thereby stabilizing the connection between the mating member and the sensing member.

In a specific embodiment, the detachably connecting of the sensing member to the outer pod further includes: fixedly connecting an inner shell of the sensing member to a wall of the outer pod, and fixing an outer shell of the sensing member to the inner shell, wherein the inner shell is provided with the sensing terminal and the outer shell is provided with the connection terminal.

In a specific embodiment, the detachably connecting of the sensing member to the outer pod further includes: sandwiching a wall of the outer pod between an inner shell and an inner shell of the sensing member, wherein the inner shell is provided with the sensing terminal and the outer shell is provided with the connection terminal.

It is a further object of the present invention to provide a detection device for a substrate storage apparatus to read information of an accommodating space. The detection device includes: a sensing member, having a sensing terminal, a connection terminal, and a cavity extending between the sensing terminal and the connection terminal, the cavity accommodating a sensor and the cavity being in flow communication with an outside of the sensing member through the sensing terminal; and an mating member, having an mating terminal and a circuit component, wherein the mating terminal is detachably connected to the sensing member and electrically connected to the sensor, and the circuit component is electrically connected to the sensor through the mating terminal.

In a specific embodiment, the connection terminal of the sensing member is provided with a first connector, the mating terminal of the mating member is provided with a second connector, and the sensing member and the mating member are detachably connected in a mounting direction, such that the first connector and the second connector are detachably electrically connected.

In a specific embodiment, the mating terminal of the mating member has a bow member. The bow member is detachably joined to the sensing member.

In a specific embodiment, the sensing member is configured to detachably match and be connected to a mounting hole of the substrate storage apparatus, the mating member has at least one connection arm, and the connection arm is configured to join with a rib of the substrate storage apparatus.

In a specific embodiment, the circuit component includes a processing unit, a display module and a wireless communication module.

BRIEF DESCRIPTION OF THE DRAWINGS

Reference can be made to the drawings and description below to better understand the present invention. Non-limiting and non-exhaustive embodiments are described with reference to the drawings below. It is to be noted that the components in the drawings are not necessarily drawn to their actual sizes, and are depicted to focus on the description of structures and principles.

DETAILED DESCRIPTION OF THE EMBODIMENTS

To better describe the present invention, specific examples and embodiments are illustrated with reference to the accompanying drawings below. However, the subject matter of the application may be specifically implemented in various different forms, and the construction covered or asserted by the subject matter of the application is not limited to any exemplary specific embodiments disclosed in the specification of the application; it should be understood that the exemplary specific embodiments are only illustrative. Similarly, the present invention aims at providing a reasonable and broad scope for the subject matter applied or covered.

The expression "in one embodiment" used in the specification of the application does not necessarily refer to the same specific embodiment, and the expression "in other (some/certain) embodiments" used in the specification of the application does not necessarily refer to different specific embodiments. The object of the above is, for example, to include combination of all or part of the exemplary specific embodiments by the subject matter set forth.

Figure 1:
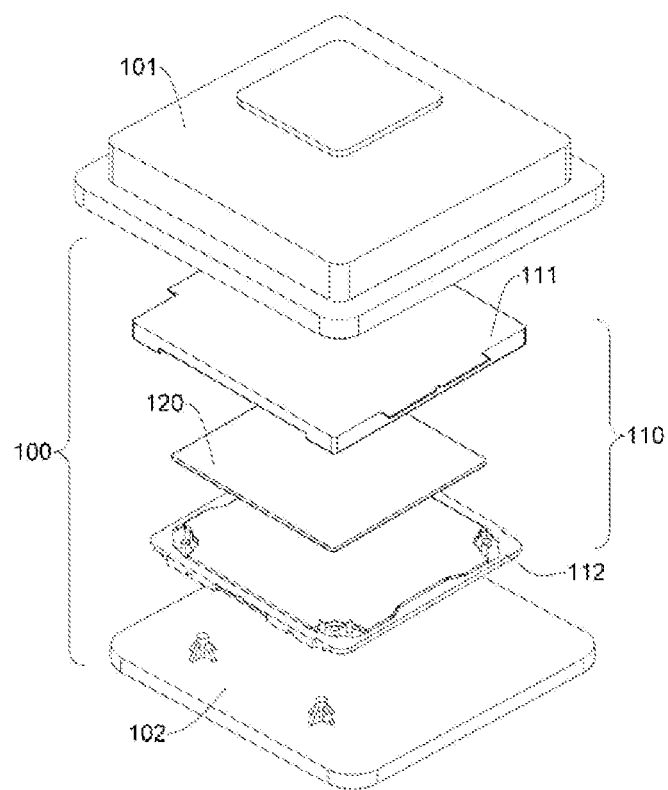
FIG. 1 is an exploded diagram illustrating a known substrate storage apparatus (shield package)
Figure 2:
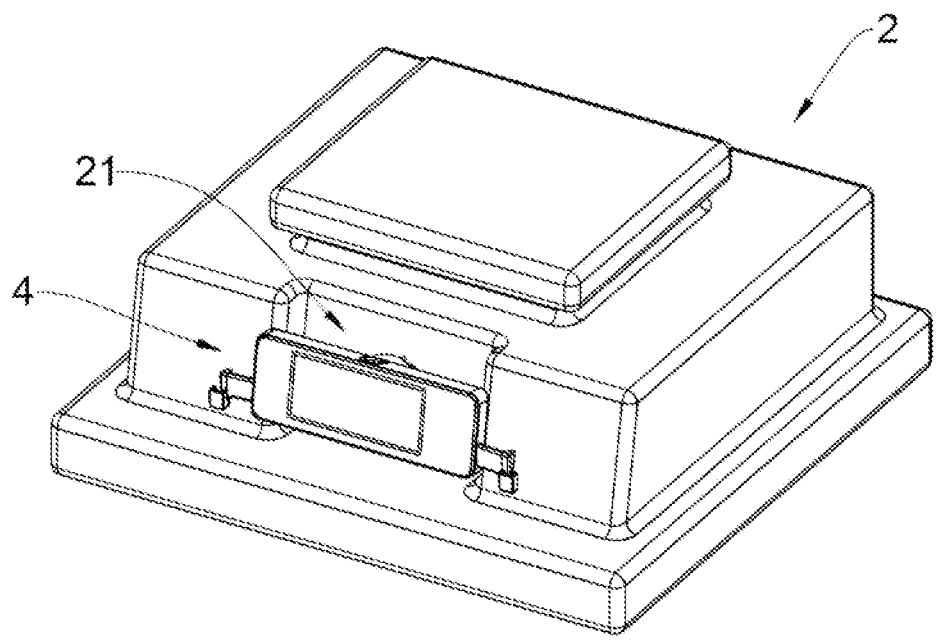
FIG. 2 is a three-dimensional diagram illustrating a substrate storage apparatus of the present invention.

FIG. 2 is a three-dimensional diagram illustrating a substrate storage apparatus of the present invention including an outer pod (2) and a detection device (4). The outer pod (2), basically similar to the outer pod (100) in FIG. 1, includes a cover and a base and defines an accommodating space for storing an inner pod (not shown) or another substrate carrier. The detection device (4) is detachably connected to the outer pod (2), for example, to a sidewall of the cover of the outer pod as shown in the drawing; however, the present invention is not limited to the above. The detection device (4) may be provided with a display module, for example, a display panel, and is used for displaying environmental information inside the outer pod (2), for example, humidity and temperature.

Figure 3:
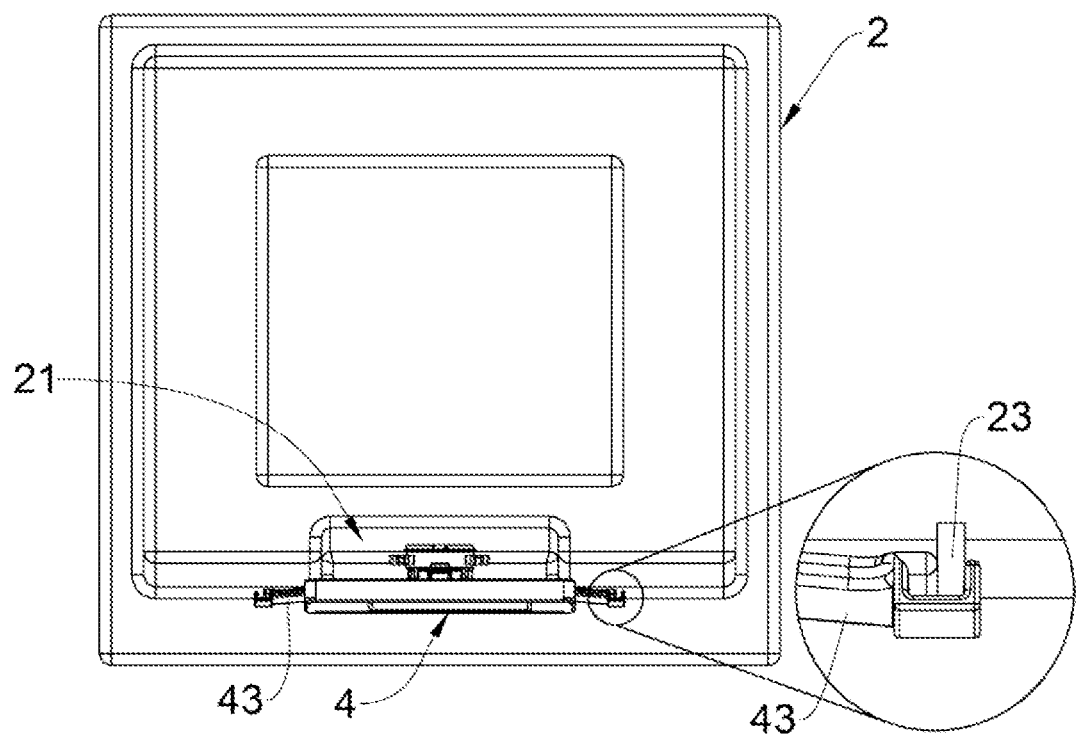
FIG. 3 is a top view of FIG. 2.
Figure 4:
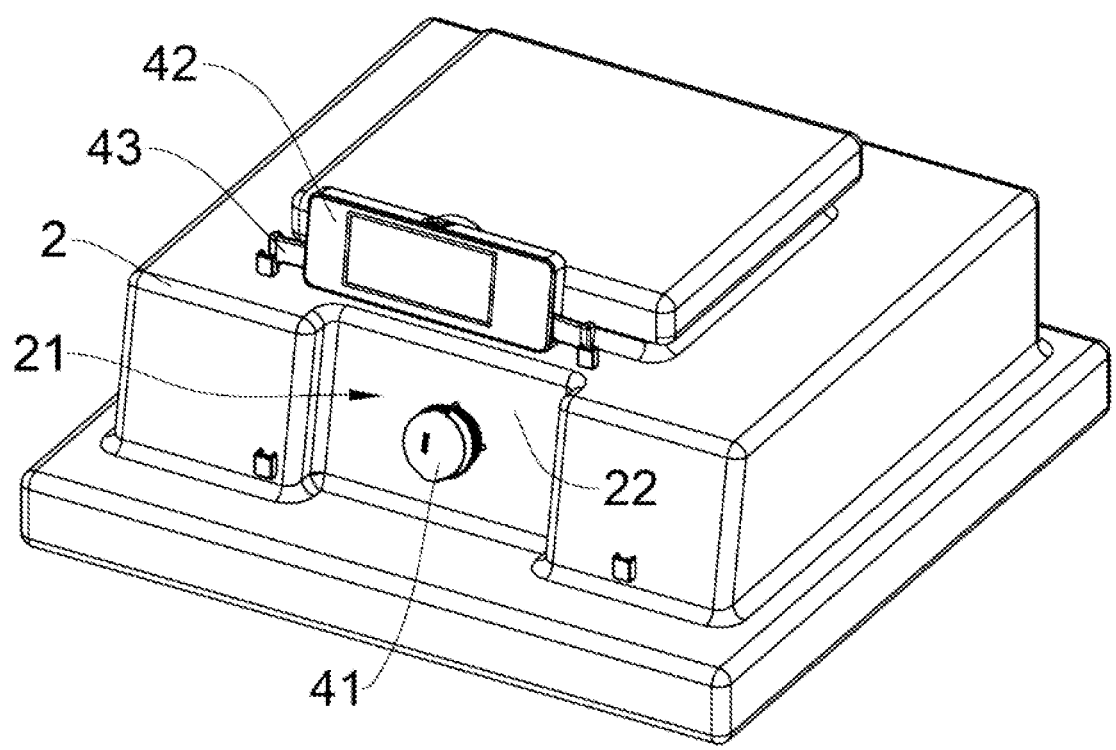
FIG. 4 shows a detection device of the present invention in a detached state.
Figure 5:
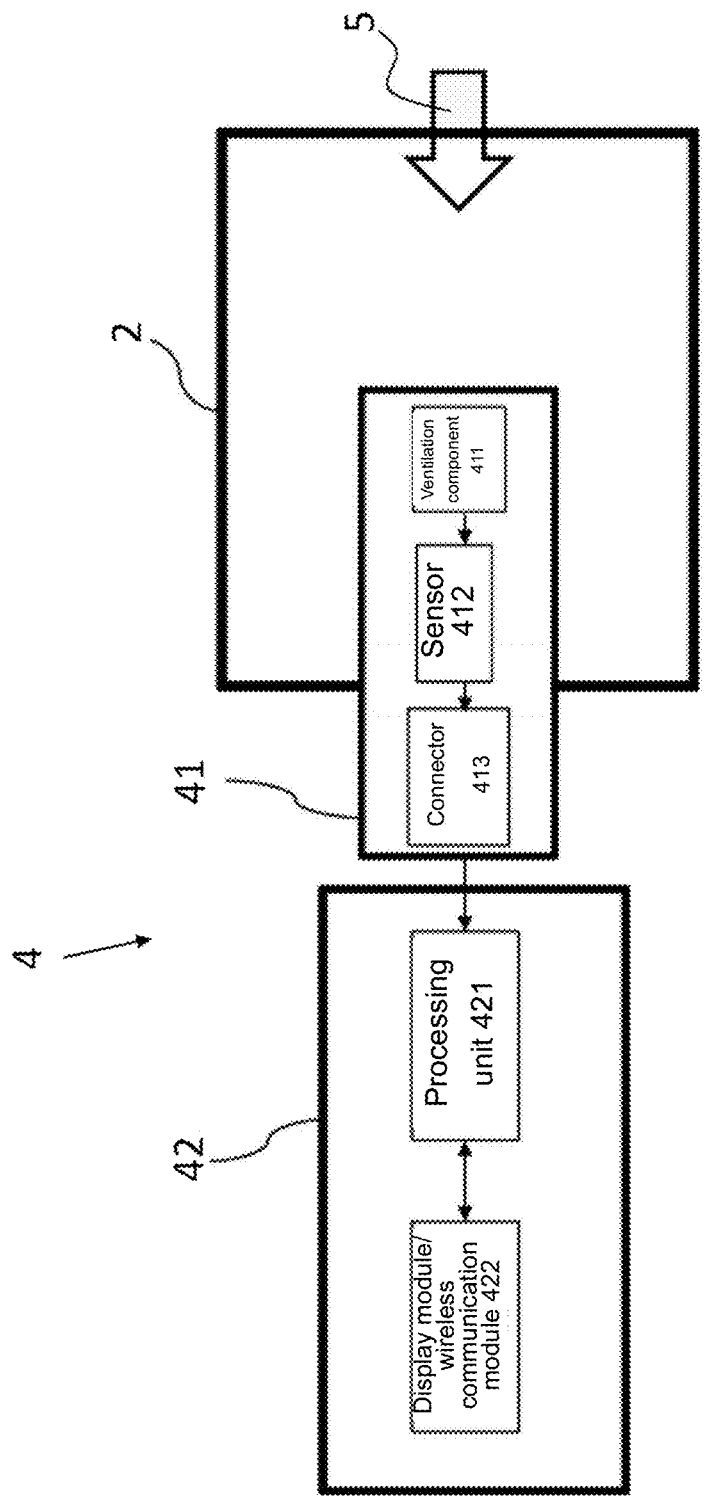
FIG. 5 is a block schematic diagram of a substrate storage apparatus of the present invention.

FIG. 3 shows a top view and its partial enlarged view of the substrate storage apparatus. FIG. 4 shows that a portion of the detection device (4) is separated from the outer pod (2). A recess (21) is formed on the sidewall of the outer pod (2), and is defined by a sidewall closer to the outside and a sidewall closer to the inside. The recess (21) provides a mounting space, providing the detection device (4) and the outer pod (2) with improved suitability. The detection device (4) includes a sensing member (41) and an mating member (42). As shown in FIG. 4, the sensing member (41) is detachably inlaid on a wall (22) of the outer pod (2). An inside of the mating member (42) is detachably connected to the sensing member (41). The mating member (42) has at least one connection arm (43) of which a free terminal is detachably connected to a corresponding rib (23) on the outer pod (2). The free terminal of the connection arm (43) is provided with a securing structure, and the rib (23) extends between the sidewall of the outer pod (2) and a plane. The securing structure of the free terminal of the connection arm (43) and the rib (23) are in matching forms, so that the connection arm (43) is enabled to more stably engage the rib (23) and prevent the mating member (42) from swaying relative to the outer pod (2). As shown in the partial enlarged diagram of FIG. 3, a securing part of the connection arm (43) may be structured similarly to a hook. As shown in the drawing, in this embodiment, two ribs (23) are respectively located on two sides of the recess (21), and the mating member (42) has two connection arms (43) symmetrically arranged on two sides. Thus, when the mating member (42) is connected to the outer pod (2), the connection arms (43) correspondingly connect to the ribs (23), respectively. However, the present invention is not limited to the example above.

FIG. 4 shows a schematic diagram of a substrate storage apparatus of the present invention. A portion of the sensing member (41) assembled on the outer pod (2) is exposed in an internal environment of the outer pod (2), and the other portion is exposed on an outside of the outer pod (2) and is connected to the mating member (42). Although not shown, the bottom of the outer pod (2) may be provided with an intake means (for example, an intake valve) for introducing a gas (5) for cleaning and drying an environment in the pod.

The sensing member (41) has a ventilation component (411), a sensor (412) and a connector (413) sequentially disposed from the inside to the outside of the outer pod (2). The ventilation component (411) effectively blocks the introduced gas from damaging the sensor (412), but still allows communication between the accommodating space in the pod and the accommodating space in the sensing member (41). The sensor (412) is used for reading environmental information of the accommodating space in the pod, for example but not limited to, numerical values of such as humidity, temperature and concentration. The connector (413) is in charge of transmitting a signal of the sensor (412) to a processing unit (421) of the mating member (42). The connector (413) may be designed according to a joining means of the sensing member (41) and the mating member (41). The connector (413) is not limited to being included in the sensing member (41), and the connector (413) may be arranged on a connection interface between the sensing member (41) and the mating member (42).

The mating member (42) has a circuit component which may include a processing unit (421) primarily used for processing readings of the sensor (412), and presenting the readings by a display module or wireless communication module (422); however, the present invention is not limited to the examples above. Using the display module or wireless communication module in the mating member (42), an operator may learn data and information associated with the environment in the pod without needing to open the outer pod (2). In a possible embodiment, apart from being electrically connected to each other, the sensing member (41) and the mating member (42) are not necessarily mutually joined. The sensing member (41) and the mating member (42) may also exchange messages through wireless communication in between.

Figure 6A:
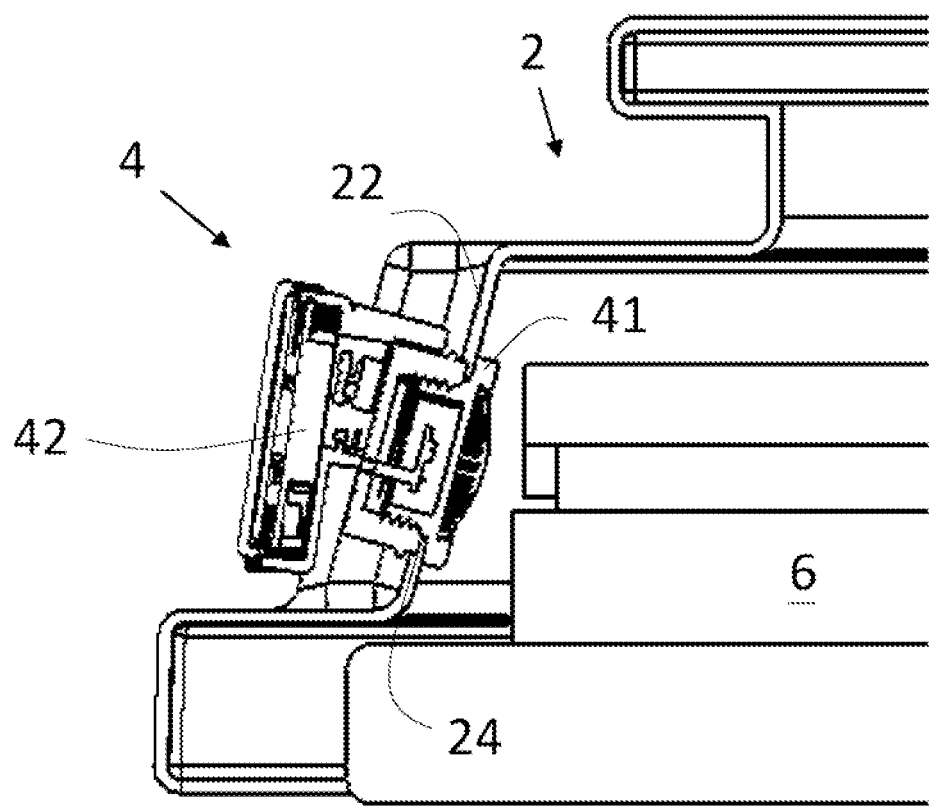
FIG. 6A and FIG. 6B are sectional diagrams according to a first embodiment of the present invention, and show an assembled detection device and an exploded diagram of the detection device, respectively.
Figure 6B:
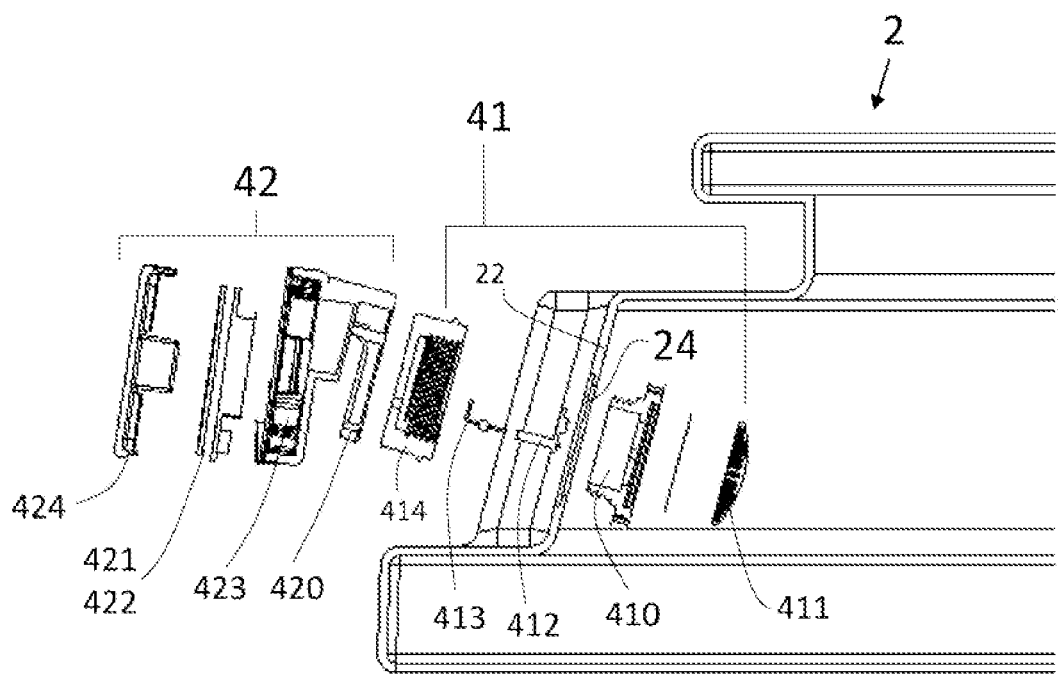
Figure 7A:
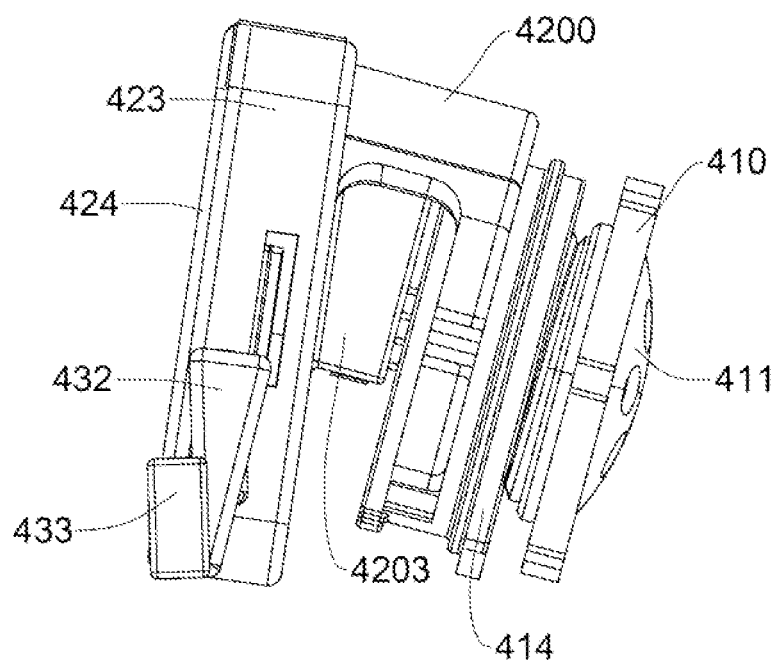
FIG. 7A to FIG. 7C are a side view, a top view and a bottom view of the detection device according to the first embodiment of the present invention, respectively.
Figure 7B:
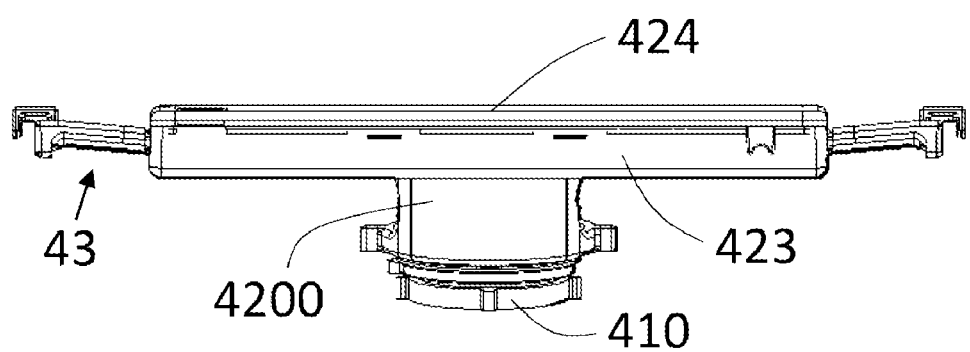
Figure 7C:
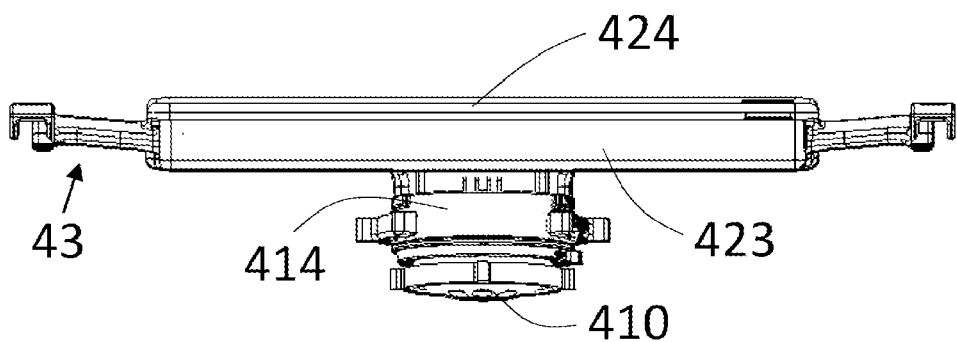
Figure 8:
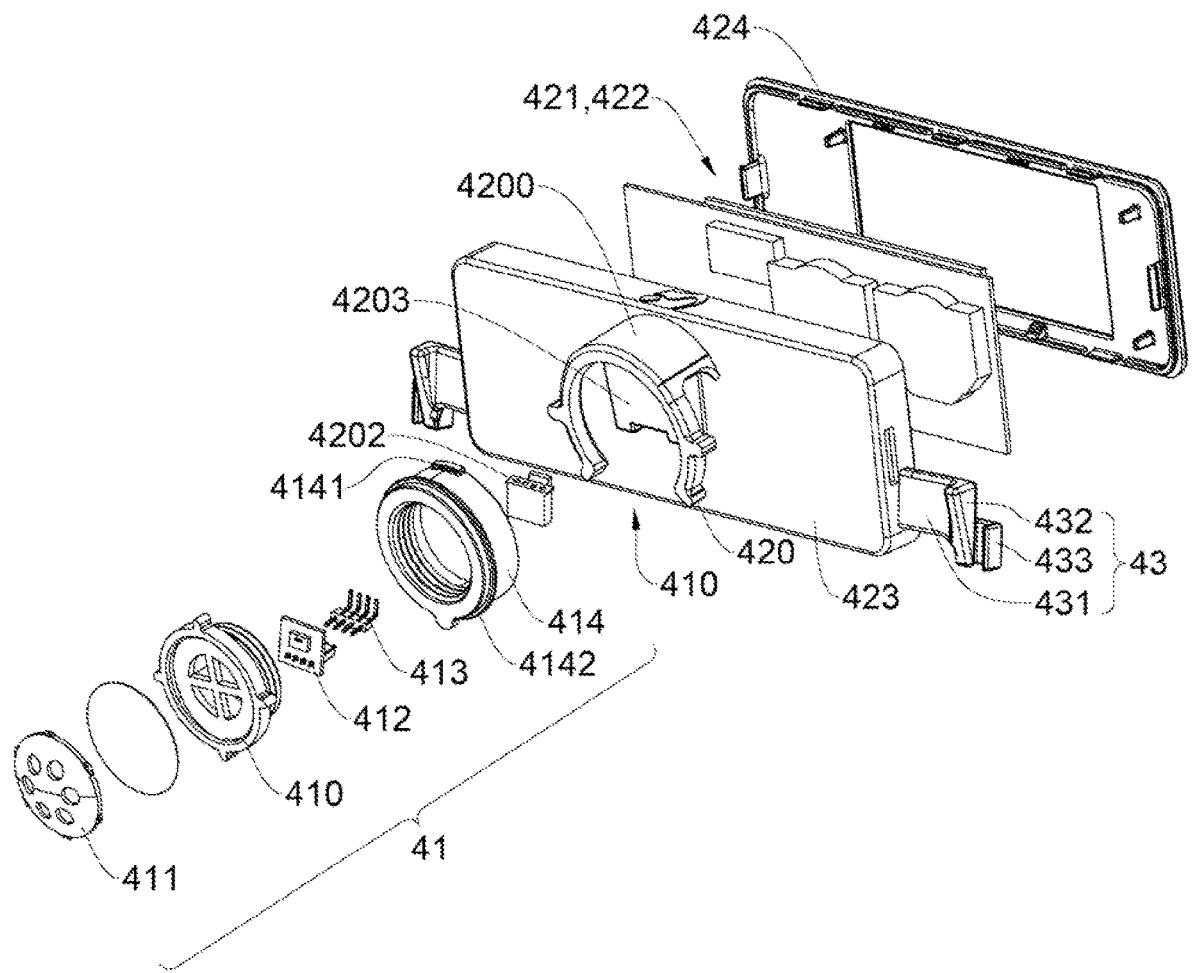
FIG. 8 is an exploded diagram of the detection device according to the first embodiment of the present invention.

FIG. 6A and FIG. 6B are sectional diagrams according to a first embodiment of the present invention, and show the assembled detection device (4) and an exploded diagram of the detection device (4), respectively. FIG. 7A to FIG. 7C are a side view, a top view and a bottom view of the detection device (4) according to the first embodiment of the present invention, respectively. FIG. 8 is a three-dimensional exploded diagram of the detection device (4) according to the first embodiment of the present invention.

A mounting hole (24) is formed on the wall (22) of the outer pod (2). When the detection device (4) is assembled through the mounting hole (24) and is inlaid on the wall (22), one terminal of the sensing member (41) is exposed in the accommodating space in the outer pod (2) and faces an inner pod (6) accommodated therein. The sensing member (41) has a sensing terminal and a connection terminal. The sensing terminal is exposed in the accommodating space on an inside of the outer pod (2), and the connection terminal is exposed on an outside of the outer pod (2). The sensing terminal primarily has an inner shell (410), a ventilation component (411) and a sensor (412). The inner shell (410) is basically in a barrel shape, and an outer surface of the inner shell (410) is provided with a screw thread and a flange. When the inner shell (410) is accommodated in the mounting hole (24), the flange of the inner shell (410) presses against an inner surface of the wall (22), and the outer surface having the screw thread passes through the mounting hole (24) and is exposed on the outside of the outer pod (2). The sensor (412) is accommodated in a cavity defined by the inner shell (410), wherein the cavity may extend to the outside and the inside of the outer pod (2). The ventilation component (411) is a cover having ventilation holes, and may be joined to an inner end of the inner shell (410). A breathable material (not denoted by a numeral) is placed between the inner shell (410) and the ventilation component (411).

The connection terminal has an outer shell (414) that has an inner surface on which a screw thread is formed, such that the inner surface of the outer shell (414) and the outer surface of the inner shell (410) may be detachably joined and the outer shell (414) is exposed on the outside of the outer pod (2). As the assembled sensing member (41) shown in FIG. 6A, the wall (22) is sandwiched between the inner shell (410) and the outer shell (414) that are mutually joined, so that the sensing member (41) does not move between the outside and the inside. One end of the first connector (413) is electrically connected to the sensor (412), and the other end extends to an outside of the outer shell (414) through an opening (not denoted by a numeral). The first connector (413) is an L-shaped terminal, and thus the other end of the first connector (413) substantially extends upward on the outside of the outer shell (414). Hence, the first connector (413) of the assembled sensing member (41) is exposed to the outside, so as to electrically connect to the circuit component of the mating member (42), as shown in FIG. 4. Accordingly, the assembly sequence of the sensing member (41) may include the following steps. The outer surface having the screw thread of the inner shell (410) of the sensing terminal is extended from the inside of the outer pod (2) through the mounting hole (24) to the outside of the outer pod (2). The outer shell (414) securing the first connector (413) and the sensor (412) is aligned with the inner shell (410), and the screw thread on the inner surface of the outer shell (414) is joined with the screw thread on the outer surface of the inner shell (410). The inner shell (410) and the outer shell (414) are turned relatively until the sensing member (41) is securely inlaid on the wall (22). The disassembly process is in reverse order of the steps above.

The mating member (42) has a mating terminal (420) and a housing (423), and the two may be integrally formed. The mating terminal (420) extends from an inside of the housing (423) and is detachably connected to the outer shell (414) at the connection terminal of the sensing member (41), as shown in FIG. 7A to FIG. 7C. The connection between the mating terminal (420) and the outer shell (414) includes an electrical connection mechanism; that is, when the mating terminal (420) is joined to the outer shell (414), an electrical connection is simultaneously established for both. Referring to FIG. 7A and FIG. 8, the mating terminal (420) has a shield (4200) and a bow member (not denoted by a numeral). The bow member curves and extends downward from the shield (4200) of the mating terminal (420), and the bow member may be elastic so as to be readily joined to the outer surface of the outer shell (414). In this embodiment, the outer shell (414) is in a barrel shape, and is matchingly joined with the bow member. For joining, the outer shell (414) enters the bow member through a channel (4201) amid the bow member, such that the bow member is stretched and an axial movement thereof is retained by a limiting block (4141) of the outer shell (414) to prevent sliding off of the mating terminal (420). For disassembly, the mating terminal (420) is lifted to overcome the elastic force of the bow member, so that the outer shell (414) departs from the channel (4201). A sealing ring (4142) may be arranged on the outer surface of the outer shell (414) to prevent a gas from leaking out.

The mating terminal (420) is further provided with a second connector (4202) between the shield (4200) and the housing (423) and a receptacle (4203) receiving the second connector (4202). The second connector (4202) is a small-size data bus, and is detachably received in the receptacle (4203), such that one end of the second connector (4202) faces downward to be detachably connected to the first connector (413), and the other end is electrically coupled to the circuit component secured in the housing (423) to thereby transmit the sensing signal. However, the present invention is not limited to the example above. The second connector (4202) may be arranged at other positions of the mating terminal (420), or the second connector (4202) and the mating terminal may be integrally formed.

The housing (423) is basically a rectangle body; however, the present invention is not limited thereto. An outside of the housing (423) is used for storing the circuit component, including the processing unit (421) and the display module or wireless communication module (422) which may be integrated on a circuit board. The housing (423) has a length, a width and a thickness, wherein the length and the width define an inner surface, and the mating terminal (420) is located on the inner surface. The inner surface of the housing (423) and the shield (4200) exhibit an inclined relation, as shown in FIG. 7A, and this is for adapting to the direction of the assembled sensing member (41). The width and the thickness define two sides of the housing (423), and the connection arm (43) is arranged on each of the two sides. In this embodiment, each connection arm (43) has a horizontal extension member (431), a vertical extension member (432) and an engaging member (433). The horizontal extension member (431) horizontally extends from two sides of the housing (423), the vertical extension member (432) extends downward from an end of the horizontal extension member (431), and the engaging member (433) is arranged on a bottom end of the vertical extension member (432). Thus, the vertical extension member (432) and the engaging member (433) define an engaging space, allowing entering of the rib (23) as shown in FIG. 3 and FIG. 4. Thus, while the mating member (420) is joined with the outer shell (414), the connection arm (43) at the same time is connected to the rib (23). In other embodiments, the number of the connection arms (43) may be more or less, and may be arranged at other positions. For example, the positions of the connection arm (43) and the rib (23) may be swapped; that is, the connection arm (43) is arranged on the outer pod (2) and the rib (23) is arranged on the mating member (42).

A sealing cover (424) is detachably connected to the outside of the housing (423) so as to envelop the circuit component. The sealing cover (424) may allow partial transmittance of light, so that the information presented by the display module is visible. In a possible embodiment, the sealing cover (424) may be provided with an operation interface (not shown) for an operator to input a control signal to the circuit component.

Once the sensing member (41) is assembled to the outer pod (2), the mating member (42) is then sleeved on the outer shell (414) of the connection member of the sensing member (41) exposed to the outside. A portion of the outer shell (414) is stored in the mating terminal (420) through the channel (4201) of the mating terminal (420). Two arms of the bow member apply an elastic force so as to secure the outer shell (414). While the outer shell (414) enters the mating terminal (420), the first connector (413) exposed to the outer shell (414) and the second connector (4203) of the mating member (42) are mutually joined to form an electrical connection. The connection arm (43) is also connected to the rib (23) during the connection process of the mating terminal (420) and the outer shell (414). Once the assembly and connection processes above are complete, the outer pod (2) may be forwarded into a cleaning apparatus which introduces a cleaning gas and drying gas into the accommodating space in the outer pod (2), and the sensor (413) in the sensing member (41) and the circuit component in the mating member (42) may read and record environmental information in the accommodating space. The wireless communication module (422) may send in real time the readings to a remote monitoring apparatus. For the outer pod (2) that has been cleaned and taken out, the operator may learn environmental conditions in the outer pod (2) based on the information provided by the mating member (42), without having to open up the outer pod (2) for measurement.

Figure 9A:
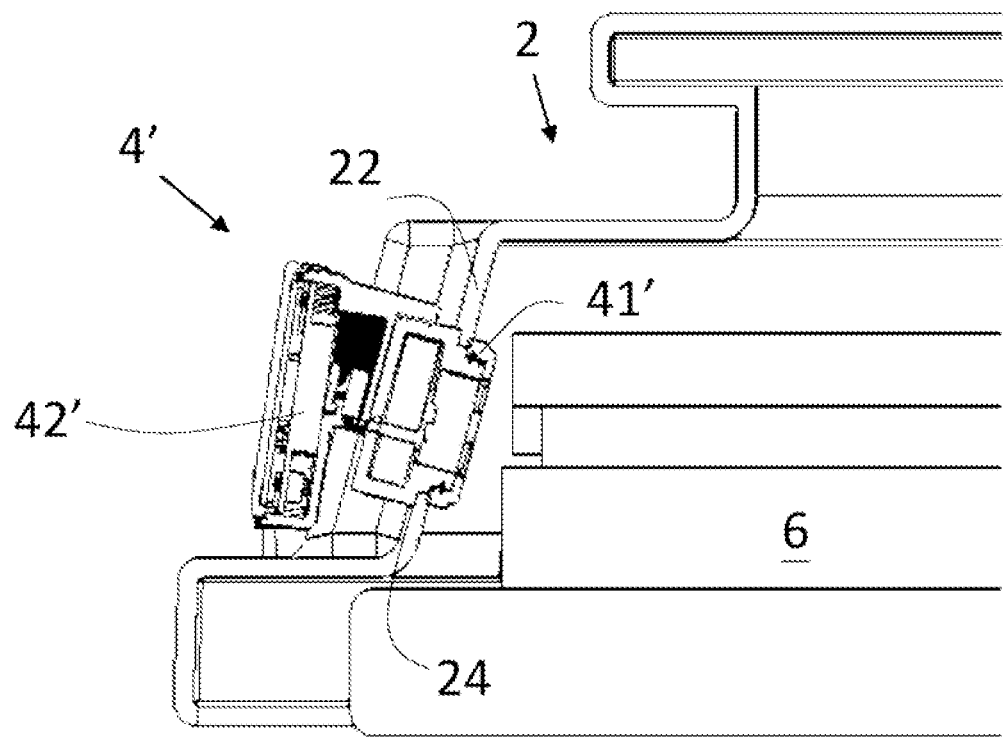
FIG. 9A and FIG. 9B are sectional diagrams according to a second embodiment of the present invention, and show an assembled detection device and an exploded diagram of the detection device, respectively.
Figure 9B:
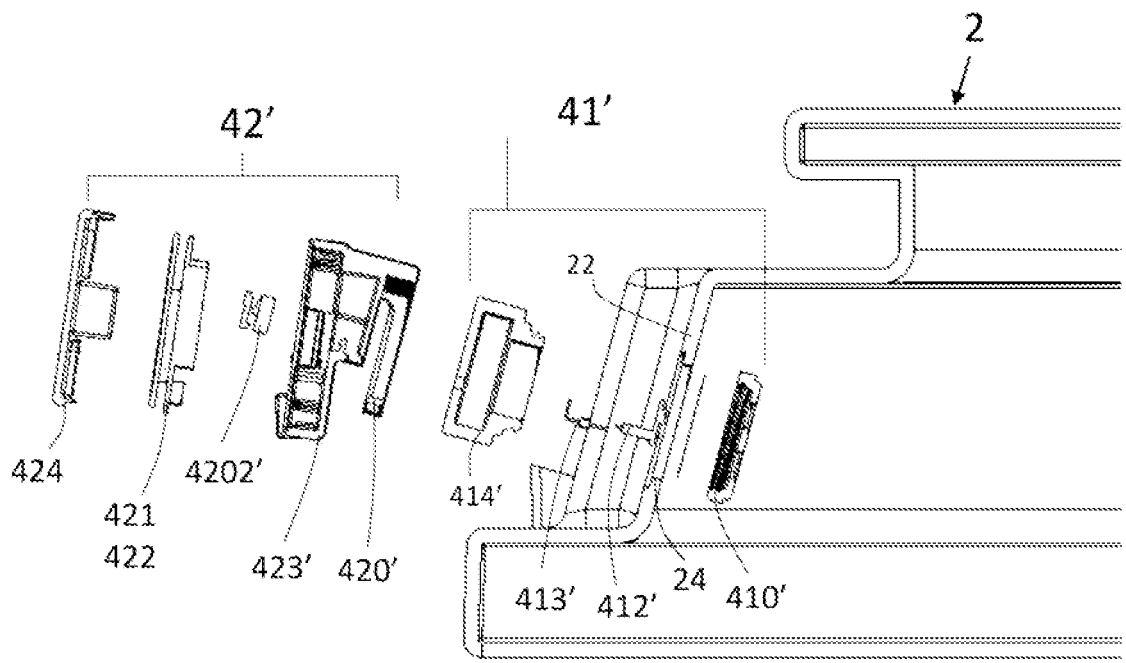
Figure 10A:
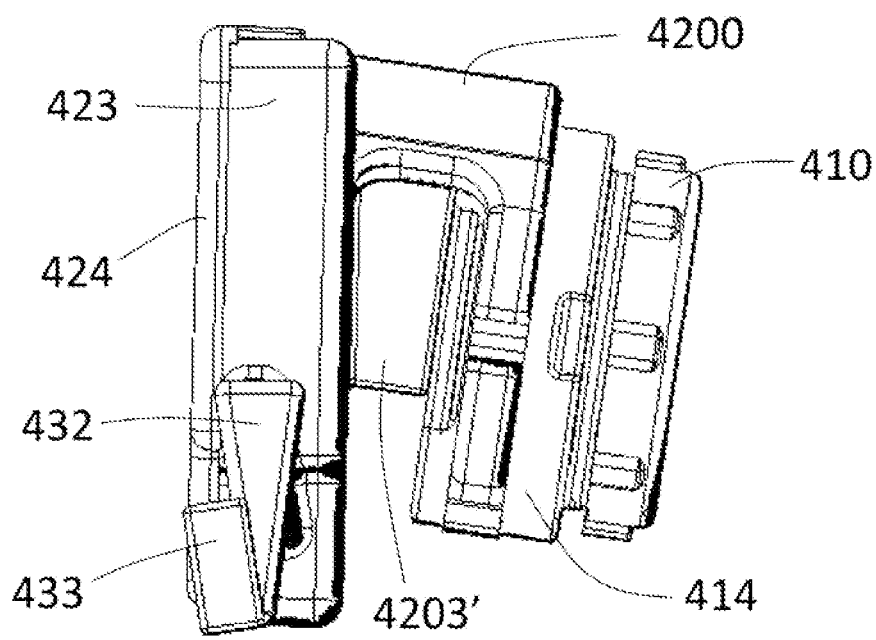
FIG. 10A to FIG. 10C are a side view, a top view and a bottom view of the detection device according to the second embodiment of the present invention, respectively.
Figure 10B:
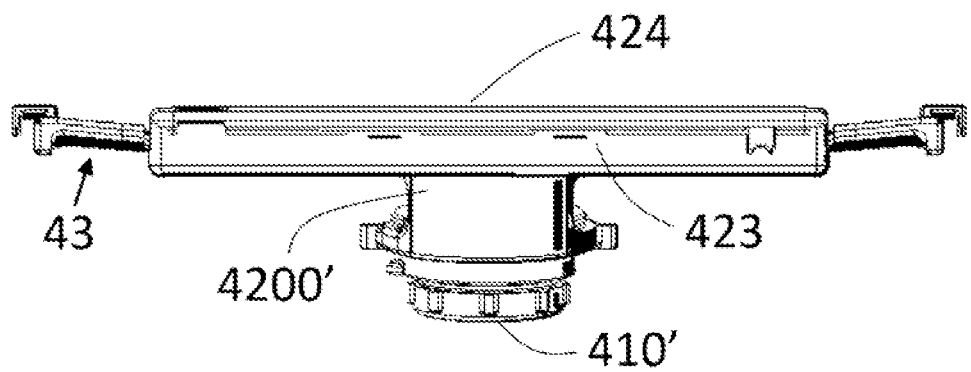
Figure 10C:
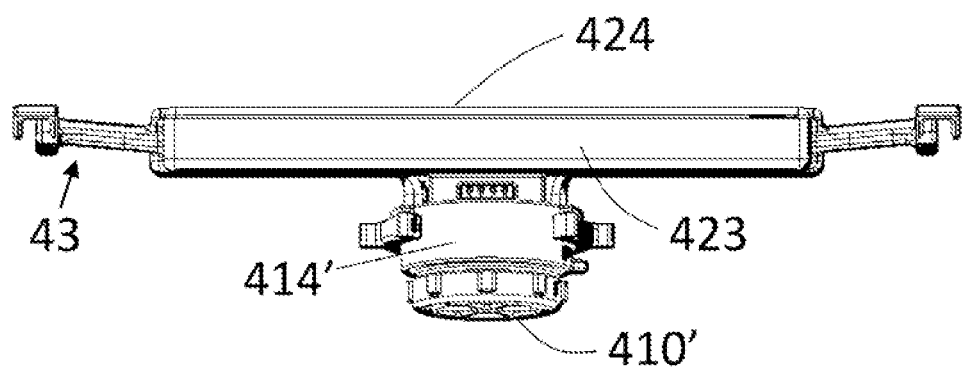
Figure 11:
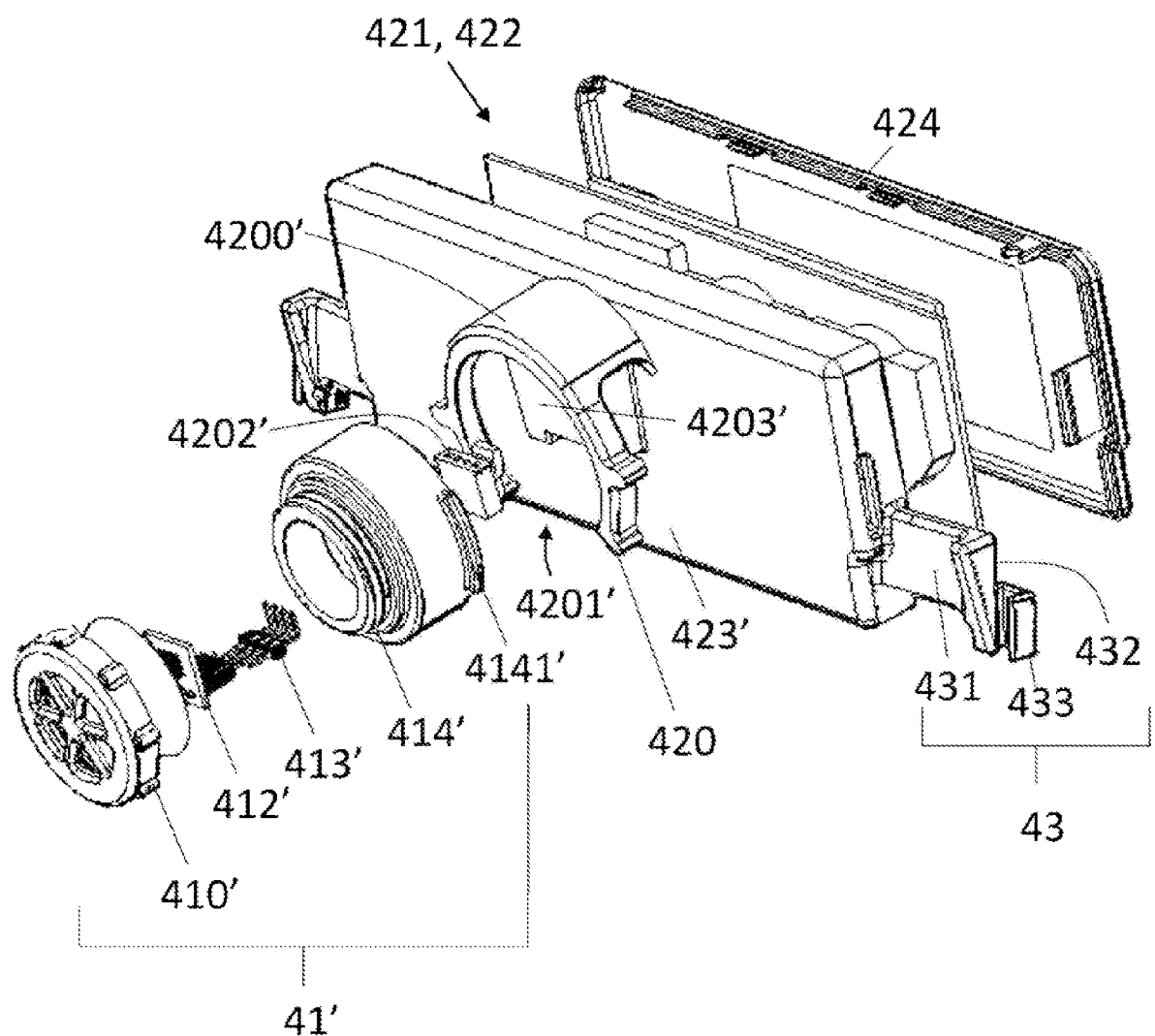
FIG. 11 is an exploded diagram of the detection device according to the second embodiment of the present invention.

FIG. 9A and FIG. 9B are sectional diagrams according to a second embodiment of the present invention, and show an assembled detection device (4') and an exploded diagram of the detection device (4'), respectively. FIG. 10A to FIG. 10C are a side view, a top view and a bottom view of the detection device (4') according to the second embodiment of the present invention, respectively. FIG. 11 is a three-dimensional exploded diagram of the detection device (4') according to the first embodiment of the present invention.

A mounting hole (24) is formed on the wall (22) of the outer pod (2). When the detection device (4') is assembled through the mounting hole (24) and is inlaid on the wall (22), one end of the sensing member (41') is exposed in the accommodating space in the outer pod (2) and faces an inner pod (6) accommodated therein. Similarly, the sensing member (41') has a sensing terminal and a connection terminal. The sensing terminal is exposed in the accommodating space on an inside of the outer pod (2), and the connection terminal is exposed on an outside of the outer pod (2). The sensing terminal primarily has an inner shell (410') and a sensor (412'). The inner shell (410') is basically in a barrel shape, and an inner surface of the inner shell (410') is provided with a screw thread. An inner end of the inner shell (410') has a hollow, as shown in FIG. 11. The sensor (412') is accommodated in a cavity defined by the inner shell (410'), wherein the cavity may extend to an inside of the outer pod (2). A breathable material (not denoted by a numeral) may be placed between the hollow of the inner shell (410') and the sensor (412'), as shown in FIG. 9B and FIG. 11. The diameter of the inner shell (410') is greater than that of the mounting hole (24) so the inner shell (410') is incapable of extending to the outside of the outer pod (2).

The connection terminal has an outer shell (414') that has an outer surface on which a screw thread is formed and a barrel member having a larger diameter. The diameter of the barrel member is greater than that of the mounting hole (24), and the diameter of the outer surface having the screw thread is smaller than those of the mounting hole (24) and the inner shell (410'), such that the barrel member having the larger diameter is incapable of passing through the mounting hole (24), the outer surface having the screw thread of the outer shell (414') and the inner surface of the inner shell (410') are detachably joined, and two ends of the outer shell (414') respectively extend to the outside and the inside of the outer pod (2). As the assembled sensing member (41') shown in FIG. 9A, the wall (22) is sandwiched between the inner shell (410') and the outer shell (414') that are mutually joined, so that the sensing member (41') does not move between the outside and the inside. Similarly, one end of a first connector (413') is electrically connected to the sensor (412'), and the other end extends to an outside of the outer shell (414') through an opening (not denoted by a numeral). The first connector (413') is an L-shaped terminal, and thus the other end of the first connector (413') substantially extends upward on the outside of the outer shell (414'). Hence, the first connector (413') of the assembled sensing member (41') is exposed to the outside, so as to electrically connect to the circuit component of the mating member (42'), as shown in FIG. 4. Accordingly, the assembly sequence of the sensing member (41') may include the following steps. The outer surface having the screw thread of the outer shell (414') of the connection terminal is extended from the outside of the outer pod (2) through the mounting hole (24) to the inside of the outer pod (2). The outer shell (410') is aligned with the outer shell (414'), and the screw thread on the inner surface of the inner shell (410') is joined with the screw thread on the outer surface of the outer shell (414'). The inner shell (410') and the outer shell (414') are turned relatively until the sensing member (41') is securely inlaid on the wall (22). The disassembly process is in reverse order of the steps above.

Similarly, the mating member (42') has an mating terminal (420') and a housing (423'), and the two may be integrally formed. The mating terminal (420') extends from an inside of the housing (423') and is detachably connected to the outer shell (414') at the connection terminal of the sensing member (41'), as shown in FIG. 10A to FIG. 10C. The connection between the mating terminal (420') and the outer shell (414') includes an electrical connection mechanism; that is, when the mating terminal (420') is joined to the outer shell (414'), an electrical connection is simultaneously established for both. Referring to FIG. 10A and FIG. 11, the mating terminal (420') has a shield (4200') and a bow member (not denoted by a numeral). The bow member curves and extends downward from the shield (4200') of the mating terminal (420') and has functions as those described above. For joining, the outer shell (414') enters the bow member through a channel (4201') amid the bow member, and a limiting block (4141') restrains an axial movement of the bow member to prevent sliding off of the mating terminal (420'). Principles for a disassembly process are the same. In a preferred embodiment, the bow member may have a structure with outstanding flexibility or multiple diameters, so that the mating terminal may adapt to outer shells having different diameters.

Similarly, the mating terminal (420') is further provided with a second connector (4202') between the shield (4200') and the housing (423') and a receptacle (4203') receiving the second connector (4202'). The second connector (4202') is a small-size data bus, and is detachably received in the receptacle (4203'), such that one end of the second connector (4202') faces downward to be detachably connected to the first connector (413'), and the other end is electrically coupled to the circuit component secured in the housing (423') to thereby transmit a sensing signal. The receptacle (4203) mentioned above and the receptacle (4203') herein differ by the positions of openings. Details of the circuit component, the housing (23) and the sealing cover (424) are the same as those of the foregoing embodiment, and so repeated description is omitted herein.

Once the sensing member (41') is assembled to the outer pod (2), the mating member (42') is then sleeved on the outer shell (414') of the connection member of the sensing member (41') exposed to the outside. While the outer shell (414') enters the mating terminal (420'), the first connector (413') exposed to the outer shell (414') and the second connector (4203') of the mating member (42') are mutually joined to form an electrical connection. Once the assembly and connection processes above are complete, the outer pod (2) may be forwarded to a cleaning apparatus or transported to a storage warehouse, and the operator may learn environmental conditions in the pod based on the information provided by the mating member (42), without having to open up the pod.

Figure 12:
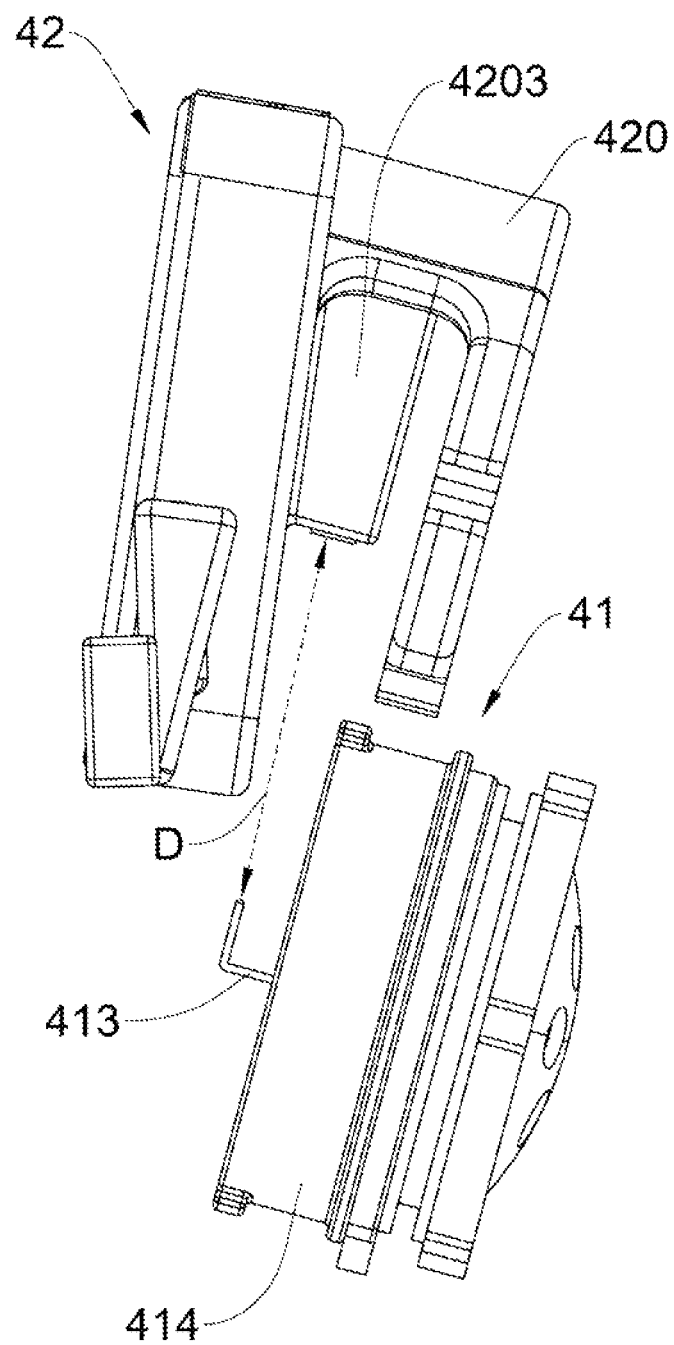
FIG. 12 depicts a mounting direction of the detection device according to the second embodiment of the present invention.

FIG. 12 depicts a mounting direction of the mating member (42') according to the second embodiment of the present invention, and this may similarly be applied to the first embodiment. Although the wall (22) of the outer pod (2) is omitted from the drawing, it should be understood that the assembled sensing member (41') appears lightly inclined, and a free end of the exposed first connector (413') also extends in an inclining direction, hence determining a mounting direction (D) of the sensing member (41') and the mating member (42'). For joining, an downward facing opening of the receptacle (4203') of the mating member (42') is aligned with the free end of the first connector (413') and approaches thereto in the mounting direction (D), until the first connector (413') and the second connector (4202') are joined and the mating terminal (420') is joined with the outer shell (414'). However, the present invention is not limited to the examples above. For example, a magnetic connection means may be configured between the mating member (42') and the sensing member (41'), such that these two parts may be mutually attracted and thus connected. In other possible embodiments, the sensing member and the mating member may be integrally formed and are inseparable. Alternatively, the mating member and the sensing member are not necessarily structurally connected together; instead, the first connector and the second connector may be connected by wireless or wireless communication in between. The sensing member is not necessarily inlaid on the sidewall of the outer pod (2), and may be inlaid on the top or the bottom of the outer pod (2).

On the basis of the description above, the present invention provides a substrate storage apparatus which securely stores an electronic component in a chemical environment in a pod by using a detachable means of a detection device and a detachable means between the detection device and an outer pod structure, and creates a monitoring strategy different from the prior art.

What is claimed is:

1. A substrate storage apparatus, having an outer pod accommodating an inner pod and a detection device detachably connected to the outer pod, the inner pod used for accommodating a substrate, the detection device comprising:
   a sensing member, having a sensing terminal provided on an inside of the outer pod and a connecting terminal provided on an outside of the outer pod, the sensing terminal and the connecting terminal detachably connected to each other such that the sensing member is detachably mounted to the outer pod, the sensing terminal having a cavity and a sensor received in the cavity, when the sensing member connected to the outer pod the sensing terminal is exposed in an accommodating space on the inside of the outer pod, the cavity is in flow communication with the accommodating space of the outer pod through the sensing terminal, thereby allowing the sensor to read information associated with the accommodating space.

2. The substrate storage apparatus according to claim 1, wherein the sensing terminal of the sensing member has a ventilation component, allowing flow communication of the cavity of the sensing member with the accommodating space of the outer pod through the ventilation component.

3. The substrate storage apparatus according to claim 1, wherein the connection terminal is provided with a first connector electrically coupled to the sensor and used for transmitting a sensing signal.

4. The substrate storage apparatus according to claim 3, wherein the first connector extends from the connection terminal of the sensing member to the outside.

5. The substrate storage apparatus according to claim 3, wherein the sensing member comprises an outer shell and an inner shell, the outer shell and the inner shell are mutually detachably connected to the cavity and define the cavity, the outer shell is provided with the connection terminal exposed on the outside of the outer pod, and the inner shell is provided with the sensing terminal exposed in the accommodating space of the outer pod.

6. The substrate storage apparatus according to claim 5, wherein an inner surface of the outer shell is connected to an outer surface of the inner shell, and the inner shell extends between the outside and the accommodating space of the outer pod.

7. The substrate storage apparatus according to claim 5, wherein an outer surface of the outer shell is connected to an inner surface of the inner shell, and the outer shell extends between the outside and the accommodating space of the outer pod.

8. The substrate storage apparatus according to claim 5, wherein the outer shell and the inner shell are mutually rotatably and detachably connected.

9. The substrate storage apparatus according to claim 5, wherein the outer shell and the inner shell are fixed on a wall of the outer pod, and the wall is sandwiched between the outer shell and the inner shell.

10. The substrate storage apparatus according to claim 5, wherein the detection device further comprises:
    an mating member, having an mating terminal and a housing, the mating terminal extending from the housing and detachably connected to the outer shell of the sensing member, the housing accommodating a circuit component, and the circuit component electrically coupled to the first connector through the mating terminal.

11. The substrate storage apparatus according to claim 10, wherein the mating terminal is provided with a second connector, and the second connector structurally matches and is electrically connected to the first connector so as to receive the sensing signal.

12. The substrate storage apparatus according to claim 11, wherein the first connector extends in a mounting direction from the connection terminal of the sensing member to the outside, and the second connector is detachably connected in the mounting direction to the first connector, such that the mating terminal of the mating member is detachably connected to the outer shell of the sensing member.

13. The substrate storage apparatus according to claim 12, wherein the mating terminal has a bow member, and the bow member is detachably engaged with the outer shell of the sensor, such that the mating member is connected to the sensing member.

14. The substrate storage apparatus according to claim 10, wherein the mating member further has a connection arm, and when the mating member is connected to the sensing member, a free terminal of the connection arm is fixedly connected to the outer pod, thereby stabilizing the connection between the mating member and the sensing member.

15. The substrate storage apparatus according to claim 10, wherein the circuit component comprises a processing unit, a display module and a wireless communication module, and the wireless communication module transmits the sensing signal.

16. A substrate storage apparatus, having an outer pod accommodating an inner pod and a detection device detachably connected to the outer pod, the inner pod used for accommodating a substrate, the detection device comprising:
- a sensing member, having a sensing terminal, a cavity and a sensor, the sensing member detachably connected to the outer pod such that the sensing terminal is exposed in an accommodating space on an inside of the outer pod, the cavity extending between an outside of the outer pod and the accommodating space and accommodates the sensor, the cavity being in flow communication with the accommodating space of the outer pod through the sensing terminal, thereby allowing the sensor to read information associated with the accommodating space;
- wherein the sensing member comprises an outer shell and an inner shell, the outer shell and the inner shell are mutually detachably connected to the cavity and define the cavity, the outer shell is provided with the connection terminal exposed on the outside of the outer pod, and the inner shell is provided with the sensing terminal exposed in the accommodating space of the outer pod.

* * * * *